United States Patent [19]

Imanishi

[11] Patent Number: 4,821,000
[45] Date of Patent: Apr. 11, 1989

[54] AUDIO OUTPUT AMPLIFIER

[75] Inventor: Kazuo Imanishi, Yokohama, Japan

[73] Assignee: Kabushiki Kaisha Toshiba, Kawasaki, Japan

[21] Appl. No.: 160,838

[22] Filed: Feb. 26, 1988

[30] Foreign Application Priority Data

Feb. 27, 1987 [JP] Japan .................................. 62-44542

[51] Int. Cl.[4] .............................................. H03F 1/52
[52] U.S. Cl. ................................ 330/298; 330/207 P; 361/98; 361/101
[58] Field of Search .............. 330/207 P, 298; 361/87, 361/89, 94, 98, 100, 101

[56] References Cited

FOREIGN PATENT DOCUMENTS 152108 7/1986 Japan .................................. 330/298

*Primary Examiner*—James B. Mullins
*Attorney, Agent, or Firm*—Finnegan, Henderson, Farabow, Garrett, & Dunner

[57] ABSTRACT

A stand-by signal is supplied to a stand-by circuit for determining the operation condition is a normal operative mode or a stand-by mode to control the operation. An output signal of the stand-by circuit is delayed by a delay circuit. An output signal from the delay circuit is supplied to a bias circuit for generating a predetermined bias voltage. An audio signal supplied from the audio signal input terminal is amplified by an amplifier circuit based on the bias voltage from the bias circuit. When it is detected by an overcurrent detection circuit that an overcurrent flows in the amplifier circuit, supply of the bias voltage from the bias circuit to the amplifier circuit is interrupted by the protection circuit. The operation of the protection circuit is controlled by output signals from the delay circuit and the overcurrent detection circuit.

14 Claims, 3 Drawing Sheets

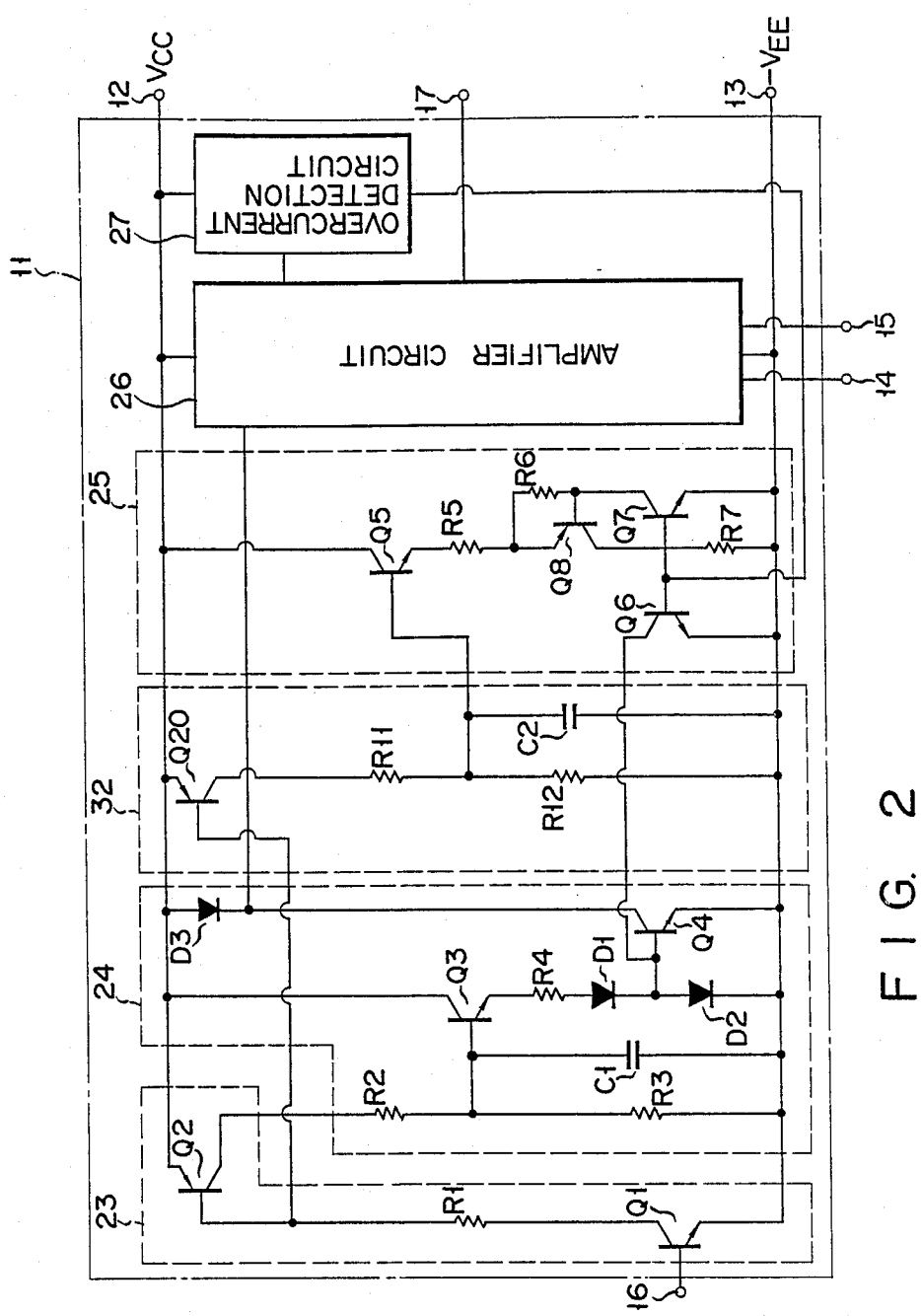
F I G. 2

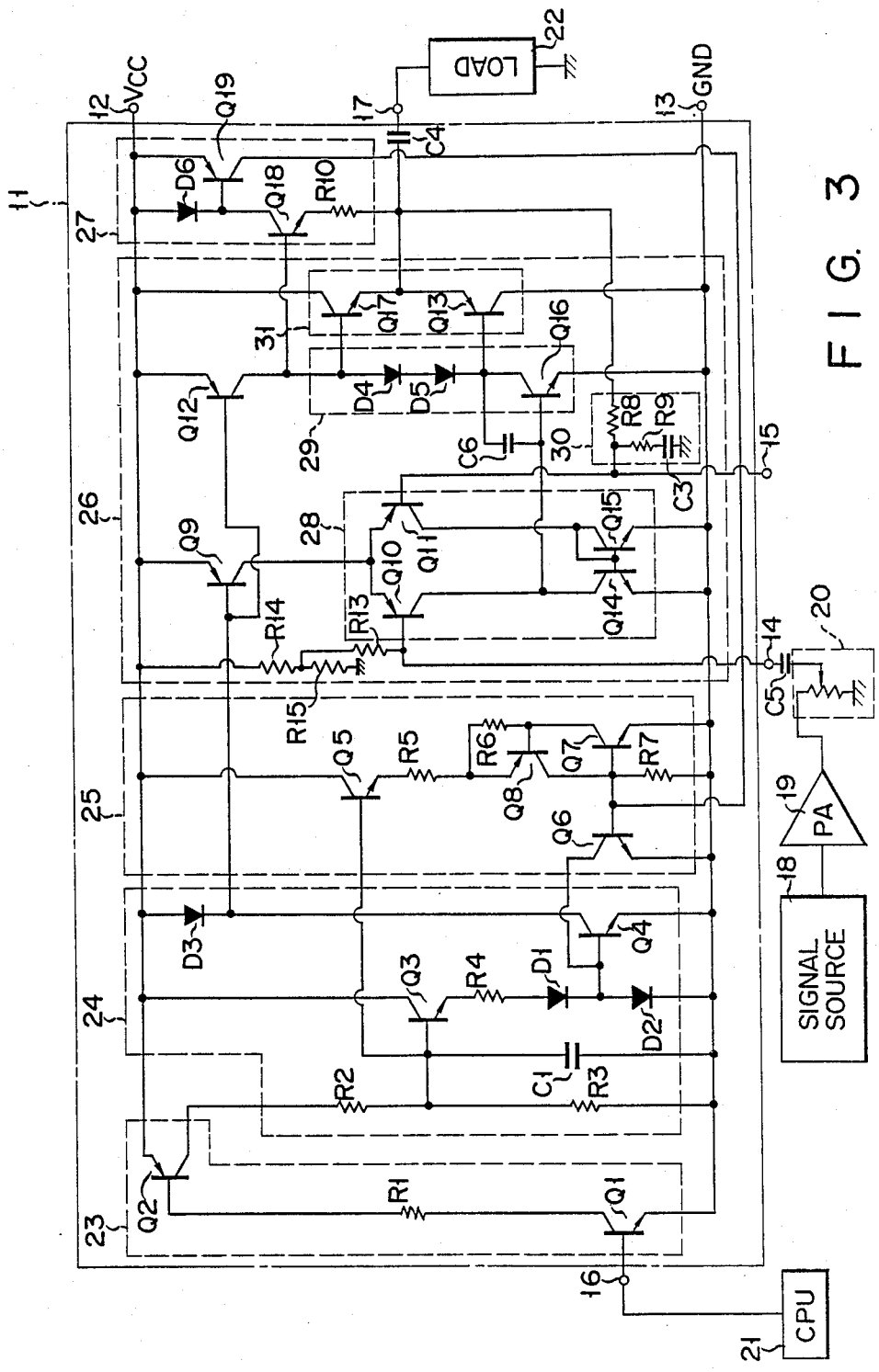
F I G. 3

AUDIO OUTPUT AMPLIFIER

BACKGROUND OF THE INVENTION

1. Field of the Invention

This invention relates to an audio output amplifier having a stand-by circuit, and more particularly to a protection circuit for preventing output elements from being damaged at the time of short circuit of the output terminal.

2. Description of the Related Art

In the prior art, an audio output amplifier includes a stand-by circuit for determining whether the operation condition is a stand-by mode or normal operation mode in response to a stand-by signal, a bias circuit controlled in response to an output signal of the stand-by circuit to generate a predetermined bias voltage, a protection circuit controlled by an output signal of the stand-by circuit, an amplifier circuit connected to receive an audio signal and a bias voltage from the bias circuit and amplify the audio signal, and an output stage element (transistor) driven by an output signal from the amplifier circuit. In the audio output amplifier with the construction as described above, a non-stand-by mode (operative mode) or stand-by mode is selectively set according to the stand-by signal supplied to the stand-by circuit. Transition from the operative mode to the stand-by mode is rapidly effected. This causes a voltage at an output terminal connected to the output stage element to be rapidly changed, thereby causing an impulsive sound to be generated from a load such as a speaker connected to the output terminal. The stand-by circuit is also used to attain the audio output muting function, for example.

In order to prevent the impulsive sound from being generated, it is a common practice to delay the stand-by signal supplied to the stand-by circuit by using a CR time constant circuit. When the stand-by signal is delayed, the bias voltage from the bias circuit slowly drops, and therefore the output voltage generated from the output terminal is slowly lowered. This successfully prevents occurrence of the impulsive sound.

In a case where an abnormal condition occurs, for example, when the output terminal of the audio output amplifier is grounded, the protection circuit is operated. If transition from the operative mode to the stand-by mode occurs in the abnormal condition, the output signal of the bias circuit is slowly lowered in the transition process. At this time, since the protection circuit is immediately set into the nonoperative condition, a bias voltage is supplied to the bias circuit without any protection. Therefore, in this case, the amplifier circuit amplifies the audio signal based on the bias voltage. For this reason, if the abnormal condition as described above occurs in the transition process from the operative mode to the stand-by mode, the output stage element may be damaged.

SUMMARY OF THE INVENTION

An object of this invention is to provide an audio output amplifier in which an output stage element can be effectively protected from being damaged in the transition process from the operative mode to the stand-by mode.

According to one embodiment of this invention, there is provided an audio output amplifier comprising a first power source terminal connected to be set at a power source potential; a second power source terminal connected to be set at a power source potential lower than the power source potential of the first power source terminal; a stand-by signal input terminal connected to receive a stand-by signal; a stand-by circuit having an input terminal connected to the stand-by signal input terminal and determining whether the operation condition is a normal operative mode or stand-by mode; a delay circuit for delaying an output signal of the stand-by circuit; a bias circuit controlled by an output signal from the delay circuit to generate a predetermined bias voltage; audio signal input terminal connected to receive an audio signal; an amplifier circuit for amplifying the audio signal supplied from the audio signal input terminal according to the bias voltage from the bias circuit; an signal output terminal connected to the output terminal of the amplifier circuit; an overcurrent detection circuit for detecting an overcurrent flowing in the amplifier circuit; and a protection circuit controlled by an output signal from the delay circuit and connected to interrupt the supply of the bias voltage to the amplifier circuit from the bias circuit when an overcurrent is detected by the overcurrent detection circuit With this construction, since an output signal of the bias circuit slowly falls with a predetermined time constant in the transition process from the operative mode to the stand-by mode, rapid change in the voltage at the output terminal can be suppressed to prevent the occurrence of the impulsive sound. Further, the protection circuit is controlled to be set to a non-operative condition after an output signal from the bias circuit is interrupted, and the protection circuit is kept in an operative condition in the transition process from the operative mode to the stand-by mode. Thus, the protection circuit is kept operative in the transition process from the operative mode to the stand-by mode so as to protect the output stage element from damage. After the protection circuit is set non-operative, each circuit in the audio output amplifier is set in the stand-by condition, preventing a useless current flow.

BRIEF DESCRIPTION OF THE DRAWINGS

FIG. 2 is a circuit diagram of an audio output amplifier according to a second embodiment of this invention; and FIG. 3 is a circuit diagram of an audio output amplifier according to a third embodiment of this invention.

DETAILED DESCRIPTION OF THE PREFERRED EMBODIMENTS

Figure 1:
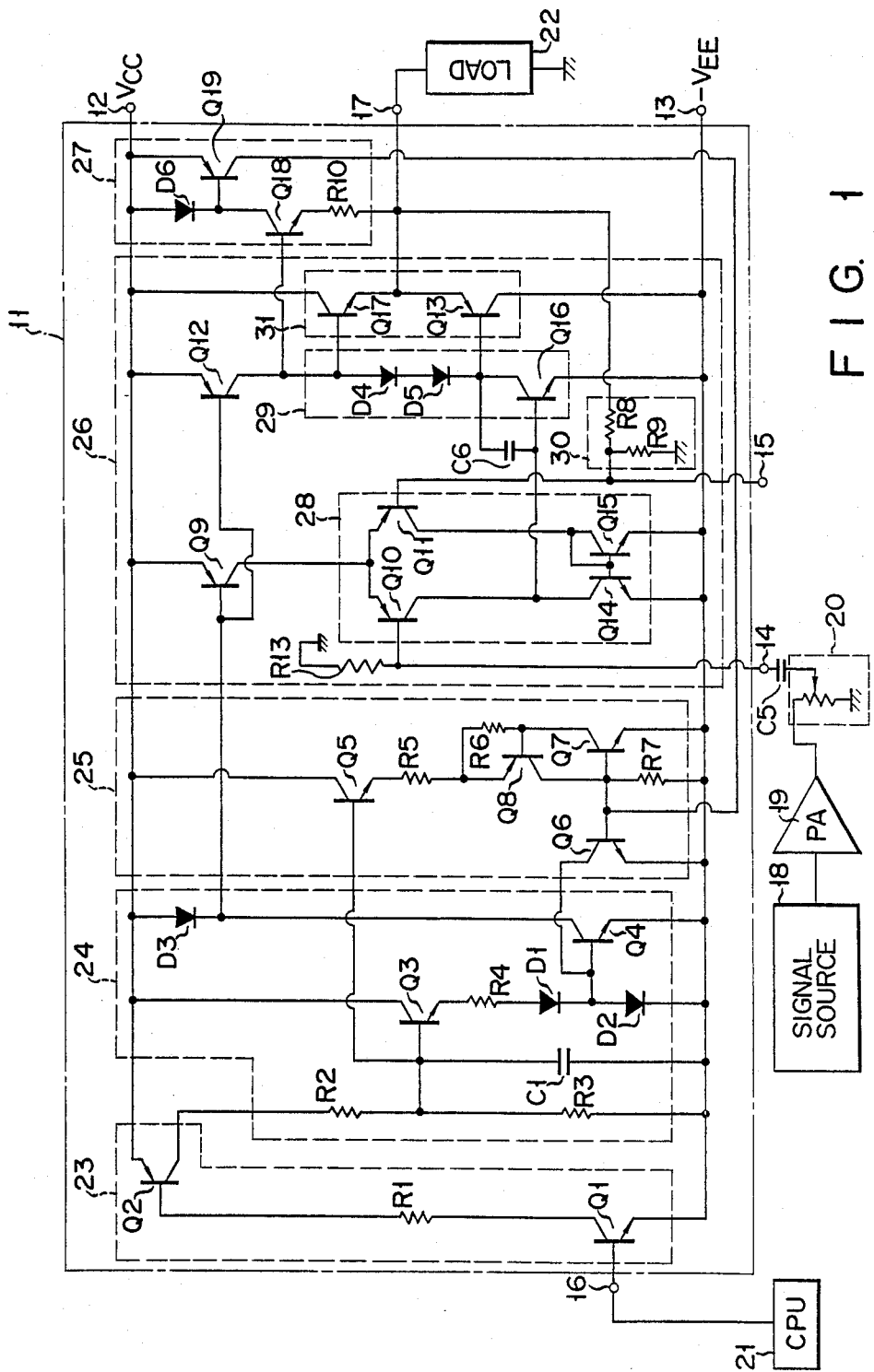
FIG. 1 is a circuit diagram of an audio output amplifier according to a first embodiment of this invention.

FIG. 1 is a circuit diagram showing an audio output amplifier according to a first embodiment of this invention. Portion defined by one-dot-dash line 11 indicates the circuit construction of an audio output amplifier which is integrated. In this embodiment, audio output amplifier 11 includes $V_{CC}$ power source terminal 12, $-V_{EE}$ power source terminal 13, non-inverting input terminal 14, inverting input terminal 15, stand-by input terminal 16 and audio signal output terminal 17. Terminal 12 is connected to receive power source voltage $V_{CC}$ and terminal 13 is connected to receive $-V_{EE}$ power source voltage. A signal generated from audio signal source 18 is amplified by amplifier 19, and an amplified output signal is set to a desired signal level adjusted by means of volume 20. The level-adjusted signal is then supplied to input terminal 14, via DC blocking capacitor C5. Terminal 14 is circuit-grounded via resistor R13. Terminal 16 is connected to receive a stand-by signal from CPU 21, for example. Terminal 17 is connected to a load 22 such as a speaker which is driven by an audio signal generated from terminal 17.

Further, audio output amplifier 11 includes standby circuit 23, bias circuit 24, protection circuit 25, amplifier circuit 26 and overcurrent detection circuit 27 which are each connected between terminals 12 and 13. Stand-by circuit 23 includes input NPN transistor Q1 for stand-by control, switching PNP transistor Q2 for stand-by control and resistor R1. The base of transistor Q1 is connected to terminal 16, the emitter is connected to terminal 13 and the collector is connected to one end of resistor R1. The other end of resistor R1 is connected to the base of transistor Q2 whose emitter is connected to terminal 12.

Bias circuit 24 is used to supply a predetermined bias voltage to amplifier 26. Bias circuit 24 includes NPN transistors Q3 and Q4, resistors R2 to R4, diodes (or PNP transistors each having a collector and a base connected together) D1 to D3, and capacitor C1. One end of resistor R2 is connected to the collector of transistor Q2, and the other end is connected to the base of transistor Q3 and to one end of resistor R3 which is connected at the other end to terminal 13. The collector of transistor Q3 is connected to terminal 12 and the emitter is connected to one end of resistor R4. Capacitor C1 is connected between the base of transistor Q3 and terminal 13. The other end of resistor R4 is connected to the anode of diode D1 whose cathode is connected to the anode of diode D2 and the base of transistor Q4. The cathode of diode D2 is connected to terminal 13. The collector and emitter of transistor Q4 are respectively connected to the cathode of diode D3 and terminal 13. Further, the anode of diode D3 is connected to terminal 12.

Protection circuit 25 is used to set amplifier circuit 26 to the non-operative condition by interrupting the supply of bias voltage from bias circuit 24 when an overcurrent is detected by means of overcurrent detection circuit 27. Protection circuit 24 includes NPN transistors Q5 to Q7, PNP transistor Q8 and resistors R5 to R7. The base of transistor Q5 is connected to the base of Q3, the collector is connected to terminal 12 and the emitter is connected to one end of resistor R5. The other end of resistor R5 is connected to the emitter of transistor Q8 and one end of resistor R6. The base of transistor Q8 is connected to the other end of resistor R6 and the collector of transistor Q7, and the collector is connected to the base of transistor Q7. The base of transistor Q7 is also connected to the base of transistor Q6 and the emitter is connected to terminal 13. The collector of transistor Q6 is connected to the base of transistor Q4 and the emitter is connected to terminal 13. Resistor R7 is connected between terminal 13 and the base connection node of transistors Q6 and Q7. Transistors Q7 and Q8 are connected to form a thyristor.

Amplifier circuit 26 includes PNP transistors Q9 to Q13, NPN transistors Q14 to Q17, resistors R8 and R9, and diodes (or PNP transistors each having a collector and a base connected together) D4 and D5. The base of transistor Q9 is connected to the cathode of diode D3, the emitter is connected to terminal 12, and the collector is connected to the emitters of transistors Q10 and Q11. The emitter of transistor Q10 is connected to the emitter of transistor Q11, the base is connected to terminal 14 and the collector is connected to the collector of transistor Q14. The base and collector of transistor Q11 are respectively connected to terminal 15 and the collector of transistor Q15. The bases of transistors Q14 and Q15 are connected together, and the base connection node is connected to the collector of transistor Q15. The emitters of transistors Q14 and Q15 are connected to terminal 13. Transistors Q10, Q11, Q14 and Q15 are connected to constitute differential amplifier section 28. Transistor Q9 functions as an operation current source for differential amplifier section 28. The base of transistor Q12 is connected to the base of transistor Q9, the emitter is connected to terminal 12 and the collector is connected to the base of transistor Q17 and the anode of diode D4. The cathode of diode D4 is connected to the anode of diode D5 whose cathode is connected to the base of transistor Q13 and the collector of transistor Q16. The base of transistor Q16 is connected to the collector of transistor Q14, and the emitter is connected to terminal 13. The base-collector of transistor Q16 is coupled via phase-compensation capacitor C6 which prevents a parasitic oscillation of amplifier circuit 26. Diodes D4 and D5 and transistor Q16 are thus connected to constitute pre-driving section 29 for amplifying an output signal of differential amplifier section 28. Each of resistors R8 and R9 is connected at one end to terminal 15. The other end of resistor R8 is connected to terminal 17, and the other end of resistor R9 is grounded Resistors R8 and R9 are connected to constitute a negative feedback circuit 30 for feeding an audio output signal to the input terminal of differential amplifier section 28 from terminal (audio signal output terminal) 17. The collector and emitter of transistor Q17 are respectively connected to terminals 12 and 17. The emitter and collector of transistors Q13 are respectively connected to terminals 17 and 13. Transistors Q13 and Q17 are thus connected to constitute output stage amplifier section 31 of complementary single ended push-pull (SEPP) type. Output stage amplifier section 31 is driven in a push-pull fashion by an output signal from pre-driving section 29.

Overcurrent detection circuit 27 includes diode (or PNP transistor having a collector and a base connected together) D6, NPN transistor Q18, PNP transistor Q19, and resistor R10. The base of transistor Q18 is connected to the collector of transistor Q12, the collector is connected to the cathode of diode D6 and the emitter is connected to one terminal of resistor R10. The anode of diode D6 is connected to terminal 12, and the other end of resistor R10 is connected to terminal 17. The emitter of transistor Q19 is connected to terminal 12, the base is connected to the collector of transistor Q18, and the collector is connected to the base connection node of transistors Q6 and Q7.

Next, the operation of audio output amplifier 11 shown in FIG. 1 is explained. In the normal operative mode, a stand-by signal supplied from CPU 21 to terminal 16 is set at an "H" level to render transistors Q1 and Q2 conductive. As a result, bias circuit 24 is set operative, lowering the potential at the collector of transistor Q4. This causes the base potentials of transistors Q9 and Q12 of amplifier circuit 26 to be lowered, thus turning on transistors Q9 and Q12 to set amplifier circuit 26 in an operative condition In this condition, an audio signal supplied from terminal 14 is amplified by amplifier circuit 26 and generated from terminal 17. The amplified audio signal is supplied to drive load 22 such as a speaker. In the normal operation mode, overcurrent detection circuit 27 is set in the non-operative condition, and protection circuit 25 is also set in the non-operative condition.

However, if an overcurrent flows transistor Q17, and the base-emitter voltage ($V_{BE}$) increases, transistors Q18 and Q19 of overcurrent detection circuit 27 are turned on. Then, the thyristor constituted by transistors Q7 and Q8 is triggered and set to a conductive state and transistor Q6 is turned on. This renders transistor Q4 of bias circuit 24 to be nonconductive and transistors Q9 and Q12 of amplifier circuit 26 are turned off. Thus, differential amplifier section 28 and pre-driving section 29 of amplifier circuit 26 are set to a non-operative condition, protecting transistors Q17 and Q13 connected at the output stage When a stand-by signal supplied to terminal 16 is set at an "L" level, transistors Q1 and Q2 are turned off. This changes the operating condition from the normal operative mode to the stand-by mode. At this time, base potential $V_{B3}$ of transistor Q3 of bias circuit 24 is slowly lowered with the time constant expressed as shown in the following eq. (1):

$$V_{B3} \approx \frac{R3}{R2 + R3} (V_{CC} + V_{EE}) \exp\left(-\frac{t}{C1R3}\right) \quad (1)$$

In eq. (1), the base input resistance of transistor Q3 is sufficiently larger than that of resistor R3. Therefore, current $I_3$ flowing through transistor Q3, and diodes D1 and D2 is slowly lowered with the time constant which is dependent on base potential $V_{B3}$ of transistor Q3 as shown by the following eq. (2):

$$I_3 \approx \frac{V_{B3} - 3V_{BE}}{R4} \quad (2)$$

where $V_{BE}$ denotes a voltage between the base and emitter of transistor Q3 and the forward voltage drop of diode D1 and D2.

Therefore, currents flowing in transistor Q4 connected to diode D2, diode D3 connected between the collector of transistor Q4 and terminal 12, and transistors Q9 and Q12 connected to the cathode of diode D3 are slowly reduced with the time constant as described above. Thus, the operating conditions of amplifier circuit 26, pre-driving section 29 and overcurrent detection circuit 27 are slowly transferred from the operative mode to the non-operative mode. Therefore, the output level of an audio output signal from terminal 17 is slowly lowered When the operating conditions of amplifier circuit 26, pre-driving section 29 and overcurrent detection circuit 27 are slowly transferred from the operative mode to the non-operative mode (stand-by mode), protection circuit 25 is still set in the operative condition. Accordingly, even if terminal 17 is grounded, protection circuit 25 is operated to protect transistors Q17 and Q13. That is, base potential $V_{B3}$ of transistor Q3 in bias circuit 24 is slowly lowered, causing the base potential of transistor Q5 of protection circuit 25 to be slowly lowered At this time, if an overcurrent is detected by overcurrent detection circuit 27, the thyristor formed of transistors Q7 and Q8 is triggered and set to a conductive state. This turns on transistor Q6 and turns off transistor Q4 of bias circuit 24. Therefore, supply of bias voltage from bias circuit 24 to amplifier circuit 26 is interrupted, setting amplifier circuit 26 to the non-operative state. Thus, output transistors Q17 and Q13 can be protected. In this case, transistor Q4 of bias circuit 24 is turned off when base potential $V_{B3}$ of transistor Q3 becomes smaller than $3V_{BE}$ as shown by the following expression (3) to turn off transistor Q3:

$$V_{B3} < 3V_{BE} \quad (3)$$

Further, the thyristor is set to a cut-off state when base potential $V_{B5}$ of transistor Q5 is set to satisfy the following expression (4):

$$V_{B5} = V_{B3} < 2V_{BE} + V_{CE8} + \left(\frac{R5}{R6} + \frac{R5}{R7}\right)V_{BE} \quad (4)$$

where $V_{CE8}$ is a voltage between the collector and emitter of transistor Q8.

Only if the circuit constants are set to satisfy the following expression (5) based on expressions (3) and (4), it is possible to turn off transistor Q3 before the thyristor formed of transistors Q7 and Q8 is turned off in the transition process from the operative mode to the stand-by mode:

$$2V_{BE} + V_{CE8} + \left(\frac{R5}{R6} + \frac{R5}{R7}\right)V_{BE} < 3V_{BE} \quad (5)$$

Thus, amplifier circuit 26 is set to the non-operative mode before protection circuit 25 is set non-operative, making it possible to protect output transistors Q17 and Q13 even in the transition process from the operative mode to the stand-by mode.

With this construction, since an output signal of bias circuit 24 is slowly lowered with a predetermined time constant in the transition process from the operative mode to the stand-by mode, rapid variation in the voltage at output terminal 17 is suppressed, preventing generation of the impulsive sound. Further, protection circuit 25 is set to the non-operative condition after an output of bias circuit 24 is interrupted, and protection circuit 25 is kept operative in the transition process from the operative mode to the stand-by mode. Therefore, protection circuit 25 is operated in the transition process from the operative mode to the stand-by mode so as to protect the output stage elements (transistors Q17 and Q13) from being damaged. After protection circuit 25 is set in the non-operative mode, each circuit in audio output amplifier 11 is set to the stand-by mode, preventing an unwanted current flow.

FIG. 2 shows an audio output amplifier according to a second embodiment of this invention. In FIG. 2, those portions which correspond to the circuit portions in FIG. 1 are denoted by the same reference numerals and the explanation thereof is omitted. Further, amplifier circuit 26 and overcurrent detection circuit 27 are constructed in the same manner as in the circuit of FIG. 1, and therefore they are shown in a block form. In this case, external circuits connected to terminals 14 to 16 are omitted. The FIG. 2 circuit is similar to that of FIG. 1 except that bias circuit 32 exclusively used for protection circuit 25 is additionally provided in the FIG. 1 circuit In the FIG. 1 circuit, bias circuit 24 is used for both protection circuit 25 and amplifier circuit 26. However, in the FIG. 2 circuit, a bias voltage is supplied from bias circuit 24 to amplifier circuit 26 and a bias voltage to protection circuit 25 is supplied from bias circuit 32. Bias circuit 32 includes PNP transistor Q20, resistors R11 and R12, and capacitor C2. The base of transistor Q20 is connected to the base of transistor Q2, the emitter is connected to terminal 12, and the collector is connected to one end of resistor R11. The other end of resistor R11 is connected to the base of transistor Q5 and one end of resistor R12. The other end of resistor R12 is connected to terminal 13. Further, capacitor C2 is connected between the base of transistor Q5 and terminal 13.

With the construction described above, the normal operation is effected in the same manner as in the FIG. 1 circuit. In the case where a stand-by signal supplied to terminal 16 is set to an "L" level and transistor Q1 is turned off to change the operation condition from the operative mode to the stand-by mode, transistor Q20 is turned off. As a result, a potential at the connection node between resistors R11 and R12 or the base potential of transistor Q5 is slowly lowered with the CR time constant defined by resistor R12 and capacitor C2. At the same time, turn-off of transistor Q1 causes transistor Q2 to be turned off. Therefore, the base potential of transistor Q3 is slowly lowered with the CR time constant defined by resistor R3 and capacitor C1.

In audio output amplifier 11, it is necessary to turn off transistor Q3 of bias circuit 24 prior to the turn-off of the thyristor of protection circuit 25 in the transition process from the operative mode to the stand-by mode. For this reason, the relation between time constant C1·R3 of bias circuit 24 and time constant C1·R12 of bias circuit 32 is set to satisfy the following expression (6):

$$C1 \cdot R3 < C2 \cdot R12 \quad (6)$$

The condition shown in expression (6) can be easily set in comparison with that shown in expression (5).

FIG. 3 shows an audio output amplifier according to a third embodiment of this invention. In the circuit of FIG. 3, those portions which are similar to the circuit portions of FIG. 1 are denoted by the same reference numerals and the explanation thereof is omitted. In the circuit of FIG. 3, power source voltage $V_{CC}$ is supplied to terminal 12 and ground potential GND is supplied to terminal 13. A series circuit of resistors R14 and R15 is connected between the $V_{CC}$ circuit and the circuit ground, and the junction between resistors R14 and R15 is coupled, via resistor R13, to the base of transistor Q10. Resistors R13-R15 constitute a bias circuit for amplifier circuit 26. Capacitor C3 is connected between resistor R9 of negative feedback 30 and the ground. Further, capacitor C4 is connected between terminal 17 and the emitter connection node of transistors Q17 and Q13. Capacitors C3 and C4 are used for DC cut-off With this construction, stand-by circuit 23, bias circuit 24, protection circuit 25, amplifier circuit 26 and overcurrent detection circuit 27 constituting audio output amplifier 11 are operated on a power source voltage between $V_{CC}$ and GND. In this embodiment, a power source voltage different from that in the FIG. 1 circuit is used, but the basic operation is the same as in the FIG. 1 circuit and the same effect can be attained.

What is claimed is:
1. An audio output amplifier comprising:
a first power source terminal connected to be set at a power source potential;
a second power source terminal connected to be set at a power source potential lower than the power source potential of said first power source terminal;
a stand-by signal input terminal connected to receive a stand-by signal;
stand-by means having an input terminal connected to said stand-by signal input terminal and determining whether the operation condition is a normal operative mode or stand-by mode;
delay means for delaying an output signal of said stand-by means;
bias means controlled by an output signal from said delay means to generate a predetermined bias voltage;
an audio signal input terminal connected to receive an audio signal;
amplifier means for amplifying the audio signal supplied from said audio signal input terminal according to the bias voltage from said bias means;
a signal output terminal connected to the output terminal of said amplifier means;
overcurrent detection means for detecting an overcurrent flowing in said amplifier means; and
protection means controlled by an output signal from said delay means and connected to interrupt the supply of the bias voltage to said amplifier means from said bias means when an overcurrent is detected by said overcurrent detection means.

2. An audio output amplifier according to claim 1, wherein said stand-by means includes a first transistor of a first conductivity type which has a base connected to said stand-by signal input terminal and an emitter connected to said second power source terminal; a resistor connected at one end to a collector of said first transistor; and a second transistor of a second conductivity type which has a base connected to the other end of said resistor, an emitter connected to said first power source terminal and a collector connected to an input terminal of said delay means.

3. An audio output amplifier according to claim 1, wherein said delay means includes first and second resistors serially connected between an output terminal of said stand-by means and said second power source terminal; and a capacitor which is connected at one end to the connection node between said first and second resistors and to an input terminal of said protection means and connected at the other end to said second power source terminal.

4. An audio output amplifier according to claim 1, wherein said bias means includes a first transistor of a first conductivity type which has a base connected to an output terminal of said delay means and a collector connected to said first power source terminal; a resistor connected at one end to an emitter of said first transistor; a first diode having an anode connected to the other end of said resistor; a second diode having an anode connected to the cathode of said first diode and a cathode connected to said second power source terminal; a second transistor of the first conductivity type which has a base connected to the anode of said second diode and to the output terminal of said protection means and an emitter connected to said second power source terminal; and a third diode having an anode connected to said first power source terminal and a cathode connected to the collector of said second transistor and to a control input terminal of said amplifier means.

5. An audio output amplifier according to claim 1, wherein said protection means includes a first transistor of a first conductivity type which has a base connected to an output terminal of said delay means and a collector connected to said first power source terminal; a first resistor connected at one end to an emitter of said first transistor; a second transistor of a second conductivity type which has an emitter connected to the other end of said first resistor; a second resistor connected between the base and emitter of said second transistor; a third transistor of the first conductivity type which has a base connected to the collector of said second transistor, a collector connected to the base of said second transistor and an emitter connected to said second power source terminal; a fourth transistor of the first conductivity type which has a base connected to the base of said third transistor and an output terminal of said overcurrent detection means, a collector connected to said bias means and an emitter connected to said second power source terminal; a third resistor connected between the base connection node of said third and fourth transistors and said second power source terminal.

6. An audio output amplifier according to claim 1, wherein said amplifier means includes a differential amplifier section having one input terminal connected to said audio signal input terminal; a first current source controlled by a bias voltage generated from said bias means and supplying an operation current to said differential amplifier section; a pre-driving section connected to receive an amplified audio signal supplied from said differential amplifier section; a second current source controlled by a bias voltage generated from said bias means and supplying an operation current to said pre-driving section and said overcurrent detection means; an output stage amplifier section driven by an output from said pre-driving section; and a negative feedback circuit for feeding back an audio signal from said signal output terminal to another input terminal of said differential amplifier section.

7. An audio output amplifier according to claim 6, wherein said differential amplifier section includes a first transistor of a first conductivity type which has an emitter connected to said second power source terminal; a second transistor of the first conductivity type which has an emitter connected to said second power source terminal and a base connected to the base of said first transistor; a third transistor of a second conductivity type which has a collector connected to the collector of said first transistor and the input terminal of said pre-driving section and a base connected to said audio signal input terminal; and a fourth transistor of the second conductivity type which has a collector connected to the collector of said second transistor and a base connection node of said first and second transistors, a base connected to said negative feedback circuit and an emitter connected to the emitter of said third transistor and said first current source.

8. An audio output amplifier according to claim 6, wherein said pre-driving section includes a transistor which has a base connected to the output terminal of said differential amplifier section and an emitter connected to said second power source terminal; a first diode having a cathode connected to the collector of said transistor and a first input terminal of said output stage amplifier section; and a second diode having a cathode connected to the anode of said first diode and an anode connected to a second input terminal of said output stage amplifier section, the input terminal of said overcurrent detection means and said second current source.

9. An audio output amplifier according to claim 6, wherein said output stage amplifier section includes a first transistor of a first conductivity type which has a collector connected to said first power source terminal, a base connected to a first output terminal of said pre-driving section and an emitter connected to said signal output terminal; and a second transistor of a second conductivity type which has an emitter connected to said signal output terminal, a base connected to a second output terminal of said pre-driving section and a collector connected to said second power source terminal.

10. An audio output amplifier according to claim 6, wherein said negative feedback circuit includes a first resistor connected between said signal output terminal and said another input terminal of said differential amplifier section; and a second resistor connected between said another input terminal of said differential amplifier section and the ground.

11. An audio output amplifier according to claim 10, further comprising a first capacitor connected between said signal output terminal and output terminal of said amplifier means; and a second capacitor connected between one end of said second resistor of said negative feedback circuit and the ground.

12. An audio output amplifier according to claim 1, wherein said overcurrent detection means includes a first transistor of a first conductivity type which has a base connected to said amplifier means; a first resistor connected between the emitter of said first transistor and said signal output terminal; a diode having a cathode connected to the collector of said first transistor and an anode connected to said first power source terminal; and a second transistor of a second conductivity type which has a base connected to the collector of said first transistor, an emitter connected to said first power source terminal and a collector connected to a control input terminal of said protection means.

13. An audio output amplifier comprising:
a first power source terminal connected to be set at a power source potential;
a second power source terminal connected to be set at a power source potential lower than the power source potential of said first power source terminal;
a stand-by signal input terminal connected to receive a stand-by signal;
stand-by means having an input terminal connected to said stand-by signal input terminal and determining whether the operation condition is a normal operative mode or stand-by mode;
delay means for delaying a first output signal of said stand-by means;
bias means controlled by an output signal from said delay means to generate a predetermined bias voltage;
an audio signal input terminal connected to receive an audio signal;
amplifier means for amplifying the audio signal supplied from said audio signal input terminal according to the bias voltage from said bias means;
a signal output terminal connected to the output terminal of said amplifier means;
overcurrent detection means for detecting an overcurrent flowing in said amplifier means;
protection delay means for delaying a second output signal of said stand-by means; and
protection means controlled by an output signal from said protection delay means and connected to interrupt the supply of the bias voltage to said amplifier means from said bias means when an overcurrent is detected by said overcurrent detection means, wherein the delay time by said protection delay means is set longer than that of said delay means.

14. An audio output amplifier according to claim 13, wherein said protection delay means includes a transistor having a base connected to an output terminal of said stand-by means and an emitter connected to said first power source terminal; first and second resistors serially connected between the collector of said transistor and said second power source terminal; and a capacitor connected at one end to a base connection node of said first and second resistors and an input terminal of said protection means and at the other end to said second power source terminal.

* * * * *